United States Patent
Oka et al.

(10) Patent No.: US 8,436,459 B2
(45) Date of Patent: May 7, 2013

(54) POWER SEMICONDUCTOR MODULE

(75) Inventors: Seiji Oka, Tokyo (JP); Yoshiko Obiraki, Tokyo (JP); Takeshi Oi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/564,560

(22) Filed: Sep. 22, 2009

(65) Prior Publication Data
US 2010/0133667 A1     Jun. 3, 2010

(30) Foreign Application Priority Data

Nov. 28, 2008   (JP) ................. 2008-303311

(51) Int. Cl.
*H01L 23/52*   (2006.01)
*H01L 23/48*   (2006.01)
*H01L 23/04*   (2006.01)
*H01L 23/34*   (2006.01)

(52) U.S. Cl.
USPC ........... 257/691; 257/692; 257/693; 257/698; 257/723; 257/E23.043

(58) Field of Classification Search ................. 257/691, 257/718, 726, 727, 693, 698, 723, 692, E23.043
See application file for complete search history.

(56) References Cited

U.S. PATENT DOCUMENTS

| | | | | |
|---|---|---|---|---|
| 3,930,114 A * | 12/1975 | Hodge | | 174/529 |
| 3,959,874 A * | 6/1976 | Coucoulas | | 29/856 |
| 4,812,949 A * | 3/1989 | Fontan et al. | | 361/719 |
| 5,371,043 A * | 12/1994 | Anderson et al. | | 29/832 |
| 5,519,252 A * | 5/1996 | Soyano et al. | | 257/690 |
| 5,698,898 A * | 12/1997 | Matsumoto | | 257/712 |
| 5,705,853 A * | 1/1998 | Faller et al. | | 257/719 |
| 5,825,085 A * | 10/1998 | Masumoto et al. | | 257/704 |
| 6,144,571 A | 11/2000 | Sasaki et al. | | |
| 6,291,880 B1 * | 9/2001 | Ogawa et al. | | 257/723 |
| 6,297,549 B1 * | 10/2001 | Hiyoshi | | 257/703 |
| 6,381,136 B1 * | 4/2002 | Nelson et al. | | 361/704 |
| 6,509,629 B2 * | 1/2003 | Yoshimatsu et al. | | 257/660 |

(Continued)

FOREIGN PATENT DOCUMENTS

| | | |
|---|---|---|
| JP | 8-316357 | 11/1996 |
| JP | 9-139461 | 5/1997 |

(Continued)

OTHER PUBLICATIONS

U.S. Appl. No. 12/577,376, filed Oct. 12, 2009, Obiraki, et al.

(Continued)

*Primary Examiner* — Teresa M Arroyo
(74) *Attorney, Agent, or Firm* — Oblon, Spivak, McClelland, Maier & Neustadt, L.L.P.

(57) ABSTRACT

A wiring process between the provided power semiconductor module and the external circuit is simple. In the power semiconductor module, a power semiconductor element and a cylindrical conductor are joined to one surface of a lead frame. An opening of the cylindrical conductor is exposed at a surface of transfer molding resin. Sealing with the transfer molding resin is performed such that terminal portions of the lead frame protrude from peripheral side portions of the transfer molding resin. The cylindrical conductor is conductive with a control circuit. The terminal portions of the lead frame are each conductive with a main circuit.

7 Claims, 10 Drawing Sheets

U.S. PATENT DOCUMENTS

| | | | |
|---|---|---|---|
| 6,603,197 B1 * | 8/2003 | Yoshida et al. | 257/676 |
| 6,914,321 B2 * | 7/2005 | Shinohara | 257/678 |
| 6,979,843 B2 * | 12/2005 | Nakajima et al. | 257/182 |
| 7,187,074 B2 * | 3/2007 | Uchiyama et al. | 257/706 |
| 7,291,914 B2 * | 11/2007 | Stolze | 257/719 |
| 7,557,442 B2 * | 7/2009 | Licht | 257/720 |
| 2002/0190374 A1 | 12/2002 | Nakajima et al. | |
| 2005/0248007 A1 * | 11/2005 | O'Shea et al. | 257/676 |
| 2010/0013085 A1 * | 1/2010 | Oi et al. | 257/693 |
| 2010/0052190 A1 * | 3/2010 | Furukawa | 257/787 |
| 2010/0117216 A1 * | 5/2010 | Lu et al. | 257/692 |
| 2010/0117219 A1 | 5/2010 | Oka et al. | |
| 2010/0201002 A1 * | 8/2010 | Hiramatsu et al. | 257/779 |
| 2011/0049531 A1 * | 3/2011 | Oka et al. | 257/77 |
| 2011/0187003 A1 * | 8/2011 | Oi et al. | 257/773 |

FOREIGN PATENT DOCUMENTS

| | | |
|---|---|---|
| JP | 11-204724 | 7/1999 |
| JP | 2000-245170 | 9/2000 |
| JP | 2001-196495 | 7/2001 |
| JP | 2003-7966 | 1/2003 |
| JP | 2007-184315 | 7/2007 |
| JP | 2008-124176 | 5/2008 |
| WO | WO 2008/090734 A1 | 7/2008 |

OTHER PUBLICATIONS

U.S. Appl. No. 12/582,246, filed Oct. 20, 2009, Oka, et al.

U.S. Appl. No. 13/086,499, filed Apr. 14, 2011, Oi, et al.

* cited by examiner

100

100

4a  4b  4c  4d

200

300

400

401

POWER SEMICONDUCTOR MODULE

BACKGROUND OF THE INVENTION

1. Field of the Invention

The present invention relates to a resin-sealed power semiconductor module, formed by transfer molding, which is excellent in terms of productivity. The present invention particularly relates to a resin-sealed power semiconductor module, formed by transfer molding, which is small in size and which realizes large-current operation.

2. Description of the Background Art

A power semiconductor module that is: small in size; capable of efficiently discharging heat generated by its operation, to the outside; and capable of operating with a large current, is a power semiconductor module sealed with resin by transfer molding.

One of such power semiconductor modules sealed with resin by transfer molding is the one in which: a power semiconductor element is mounted on one surface of a lead frame; a metal substrate that includes an aluminum plate or copper plate and includes a high thermal conductive insulation layer and a copper foil, is joined to the other surface of the lead frame; and these components are sealed with resin by transfer molding such that an aluminum plate surface or copper plate surface of the metal substrate is exposed.

In this power semiconductor module, plate-shaped terminals to be connected to external circuits protrude from peripheral side surfaces of the sealing resin of the transfer molding (see, e.g., Page 4 to 5, FIG. 1 of Japanese Laid-Open Patent Publication No. H11-204724 (hereinafter, referred to as Patent Document 1)).

Another power semiconductor module sealed with resin by transfer molding is the one in which: power semiconductor elements and terminals to be connected to external circuits are provided on a circuit pattern joined to a metal heat sink base; and these components are sealed with resin by transfer molding such that a surface of the heat sink base, which is the opposite surface to a surface having the circuit pattern formed thereon, is exposed.

In this power semiconductor module, terminals are joined to the circuit pattern so as to be substantially perpendicular to a surface of the circuit pattern. A surface of each terminal, which is opposite to a surface joined to the circuit pattern, is exposed at a surface of the transfer molding resin, which surface is in parallel to the surface of the circuit pattern.

Here, a cylinder having a screw hole, a resin-molded nut, and the like are used as terminals. Such terminals as the cylinder having a screw hole and the resin-molded nut are connected to external wiring via bolts (see, e.g., Page 7 to 9, FIGS. 2 and 6 of Japanese Laid-Open Patent Publication No. 2007-184315 (hereinafter, referred to as Patent Document 2)).

In the power semiconductor module sealed with resin by transfer molding, which is described in Patent Document 1, all the plate-shaped terminals protrude from the peripheral side surfaces of the transfer molding resin. Since a metal of each plate-shaped terminal is exposed, it is necessary to secure a sufficient insulation distance between the plate-shaped terminals.

Power semiconductor modules have a large number of terminals. For this reason, if a sufficient insulation distance is to be secured between the terminals of the power semiconductor module described in Patent Document 1 in which all the terminals protrude from the peripheral side surfaces of the transfer molding resin, the power semiconductor module becomes large-sized. This hinders size reduction of the power semiconductor module. This problem is particularly prominent in power semiconductor modules having a large number of terminals, or in power semiconductor modules having a large current carrying capacity and terminals with a large width.

In the power semiconductor module sealed with resin by transfer molding, which is described in Patent Document 2, terminals are cylinder-shaped terminals provided with holes. A cylinder having a screw hole, or a resin-molded nut, is used as a main terminal connected to a main circuit. That is, the main terminal is a terminal provided with a screw hole (hereinafter, referred to as a screw-fitted terminal). The screw-fitted terminal is connected to external wiring by a bolt.

A control terminal connected to a control circuit has a connector structure, and is connected to external wiring by a pin.

However, in the case where such a screw-fitted terminal is used as a main terminal connected to a main circuit of the power semiconductor module, it is necessary, when the current carrying capacity of the power semiconductor module is large, to connect multiple screw-fitted terminals to the main circuit in parallel, or to increase the diameter of a screw portion of the screw-fitted terminal. This also results in a large-sized power semiconductor module, and hinders size reduction of the power semiconductor module.

In the power semiconductor module described in Patent Document 1, the terminals protruding from the peripheral side surfaces of the transfer molding resin are present on the same plane. In other words, a terminal connected to a main circuit and a terminal connected to a control circuit have their plate surfaces on the same plane.

In the power semiconductor module described in Patent Document 2, the terminal connected to the main circuit and the terminal connected to the control circuit each have a surface with an opening that is positioned at one surface of the transfer molding resin.

The terminals of the power semiconductor modules described in Patent Documents 1 and 2 have such structures as above. Accordingly, in the case where different types of external circuits are connected to such a single power semiconductor module, a connecting process becomes complex. For example, the main terminal is connected to an external circuit via a bus bar substrate, cable, or the like that has a high current carrying capacity, and the control terminal is connected to an external circuit that is a printed circuit board. This causes low productivity.

SUMMARY OF THE INVENTION

The present invention solves the above problems. The object of the present invention is to provide a power semiconductor module, sealed with resin by transfer molding, which is not increased in size even if the current carrying capacity thereof increases and which is small in size and which can be connected to an external circuit by a simple connecting process.

A power semiconductor module according to the present invention includes: a lead frame; a power semiconductor element; and a cylindrical conductor. A part of the lead frame, the power semiconductor element, and the cylindrical conductor are all sealed with transfer molding resin. Terminal portions of the lead frame protrude from peripheral side portions of the power semiconductor module. An opening of the cylindrical conductor is exposed at a top surface of the power semiconductor module. Since the power semiconductor module according to the present invention has the above configuration, the power semiconductor module is small in size, and a wiring process between the power semiconductor module and external wiring is simple.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

First Embodiment

Figure 1:
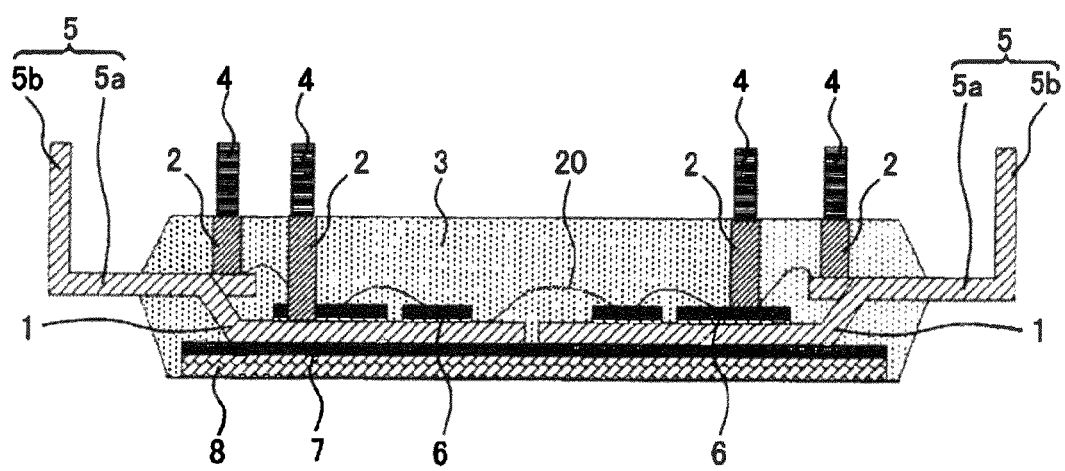
FIG. 1 is a schematic cross-sectional view showing a power semiconductor module according to the first embodiment of the present invention.

FIG. 1 is a schematic cross-sectional view showing a power semiconductor module according to the first embodiment of the present invention.

As shown in FIG. 1, in a power semiconductor module 100 of the present embodiment, power semiconductor elements 6 are mounted on one surface of a lead frame 1. The other surface of the lead frame 1, which is opposite to said one surface having the power semiconductor elements 6 mounted thereon, is joined to a metal base plate 8 via an insulation sheet 7 having high thermal conductivity, which insulation sheet 7 is interposed between the said other surface and the metal base plate 8. Metal cylinders 2, which are cylindrical conductors each having a hole and each acting as a terminal, are joined to the lead frame 1 so as to be substantially perpendicular to said one surface of the lead frame 1. The power semiconductor elements 6 and the metal cylinders 2 are joined to a wiring pattern on the lead frame 1 respectively. In this state, the power semiconductor elements 6 and the metal cylinders 2 are not electrically connected to each other yet.

Accordingly, portions that require conduction therebetween, for example, between the power semiconductor elements and between the power semiconductor elements and the lead frame, are connected via wire bonding 20. The lead frame 1, the power semiconductor elements 6, the metal cylinders 2, and the metal base plate 8 to which the insulation sheet 7 is joined, are sealed with transfer molding resin 3.

However, a surface of the base plate 8, which is opposite to a surface, of the base plate 8, joined to the insulation sheet 7, is exposed from the transfer molding resin 3. Also, portions of the metal cylinders 2, which are opposite to portions, of the metal cylinders 2, joined to the lead frame 1, are exposed from the transfer molding resin 3. In other words, the holes of the metal cylinders 2 are exposed at the top surface of the power semiconductor module 100.

The holes of the metal cylinders 2 are not filled with the transfer molding resin 3. External terminals 4 can be inserted and connected to the holes of the metal cylinders 2. FIG. 1 shows that the external terminals 4 are inserted and connected to the holes of the metal cylinders 2.

Portions 5 of the lead frame 1, which act as terminals, protrude from peripheral side portions of the transfer molding resin 3 (hereinafter, the portions 5 will be referred to as terminal portions 5). The terminal portions 5 each include: a protruding portion 5a that protrudes horizontally from the transfer molding resin 3; and a connecting portion 5b that is a bent portion to be connected to an external circuit.

In the present embodiment, the metal cylinders 2 are conductive with control circuits of the power semiconductor module, and act as control terminals. Whereas, the terminal portions 5 of the lead frame 1 are conductive with main circuits of the power semiconductor module, and act as main terminals.

Figure 2:
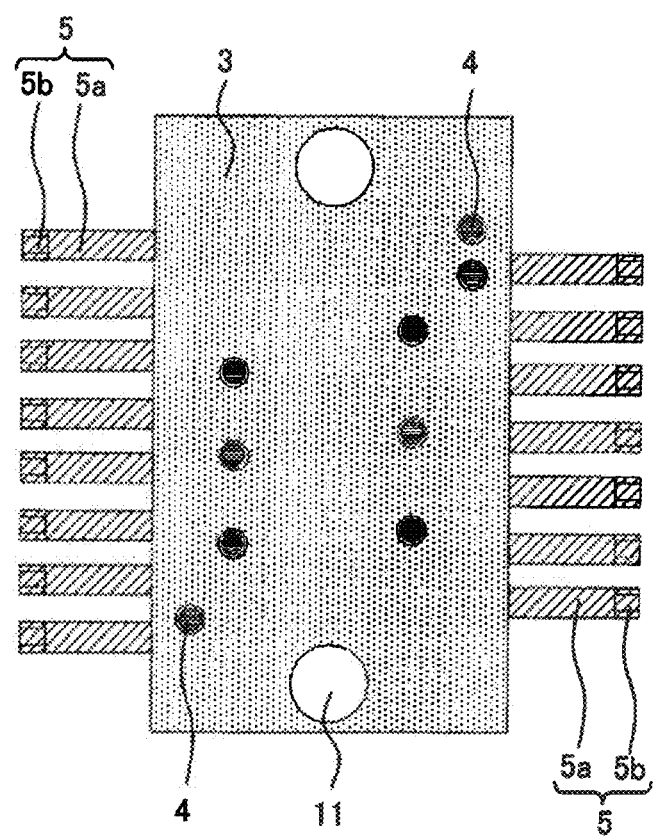
FIG. 2 is a schematic top view of the power semiconductor module according to the first embodiment of the present invention.

FIG. 2 is a schematic top view of the power semiconductor module according to the first embodiment of the present invention.

Figure 3:
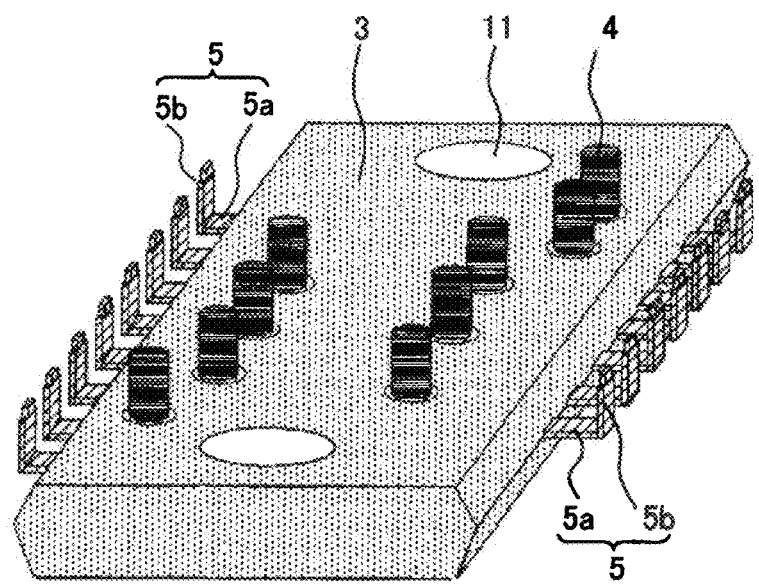
FIG. 3 is a schematic perspective view of the power semiconductor module according to the first embodiment of the present invention.

FIG. 3 is a schematic perspective view of the power semiconductor module according to the first embodiment of the present invention.

As shown in FIGS. 2 and 3, in the power semiconductor module 100 of the present embodiment, two peripheral side portions of the transfer molding resin 3, which are opposite to each other, each have multiple protruding terminal portions 5 of the lead frame 1. The multiple protruding terminal portions 5 are arranged in parallel to each other with predetermined intervals. The connecting portions 5b are bent to a side, on which side the external terminals 4 of the power semiconductor module 100 are provided.

As shown in FIGS. 2 and 3, the transfer molding resin 3 is provided with two fitting holes 11 for cooling fins. The fitting holes 11 may each have a female screw structure to be screwed onto a bolt.

In the present embodiment, copper alloy having excellent electrical conductivity and thermal conductivity is generally used for the lead frame 1. However, the present invention is not limited thereto. Different types of metal may be used as long as the metal has electrical conductivity and thermal conductivity. The thickness of the lead frame 1 is properly determined based on the current carrying capacity of each power semiconductor element 6. Aluminum wires are used for the wire bonding.

Further, in the present embodiment, it is preferred to use, for the metal cylinders 2, a metal plated with, for example, copper, copper alloy, aluminum, or aluminum alloy, which has excellent thermal conductivity and electrical conductivity and which can be joined to the lead frame 1 by soldering. Plating herein is, for example, Ni—Sn plating.

The thickness of the metal cylinders 2 is set so that the metal cylinders 2 may not be crushed due to the molding pressure of the transfer molding. The height of the metal cylinders 2 is set to such a height as to allow the external terminals, which are later inserted into the metal cylinders 2, to be connected to the metal cylinders 2 sufficiently. The inner diameters of the metal cylinders 2 are determined in accordance with outer diameters of inserted portions of the external terminals 4 that are later inserted into the metal cylinders 2. The inner diameters of the metal cylinders 2 are determined so as to allow, at least, the external terminals 4 to be attached to the metal cylinders 2. A side edge of the inner wall of the opening of each metal cylinder 2, which is exposed at the top surface of the transfer molding resin, may be chamfered so that the opening is widened at the chamfer. In this manner, the external terminals 4 can be readily inserted into the metal cylinders 2.

In the present embodiment, epoxy resin filled with silica powder filler is used as the transfer molding resin 3, for example. In the transfer molding resin 3, the content percentage of the filled silica powder is determined to be the optimal amount in consideration of a thermal expansion coefficient or the like of the material used for the lead frame 1.

In order to improve heat dissipation of the transfer molding resin 3, it is preferred to use alumina powder as the filler, instead of silica powder.

Described below is an example of a manufacturing method of the power semiconductor module of the present embodiment.

First, the metal base plate 8 is joined to the lead frame 1 via the insulation sheet 7 interposed therebetween.

Next, the power semiconductor elements 6 are joined, by soldering or the like, to power-semiconductor-element mounting portions of a surface of the lead frame 1, which surface is opposite to a surface having the base plate 8 joined thereto. Also, the metal cylinders 2 are joined, by soldering or the like, to metal-cylinder mounting portions of said surface of the lead frame 1.

Next, among the power semiconductor elements 6, the power-semiconductor-element mounting portions of the lead frame 1, and the metal-cylinder mounting portions of the lead frame 1, positions that require conduction therebetween are connected by the wire bonding 20. Accordingly, the metal cylinders 2 become conductive with the control circuits of the power semiconductor module 100, and the terminal portions 5 of the lead frame become conductive with the main circuits of the power semiconductor module 100.

Next, a structure resulting from the above processes, in which the base plate 8 is joined to the lead frame 1 via the insulation sheet 7 interposed therebetween and on which the power semiconductor elements 6 and the metal cylinders 2 are mounted and on which the wire bonding has been performed between particular positions as necessary, is set into a mold and then sealed with the transfer molding resin 3. Here, the transfer molding resin 3 can be prevented from flowing into the holes of the metal cylinders 2 by using, for example, a method called sheet molding method in which the sealing is performed, with a thermoplastic film sheet placed on the metal cylinders 2.

Lastly, after the tie bar is cut off from the lead frame 1, the terminal portions 5 are bent to form the connecting portions 5b as main terminals. In this manner, the power semiconductor module 100 is completed.

Alternatively, the power semiconductor module 100 may be completed when the external terminals 4 have been inserted into the metal cylinders 2 that act as control terminals.

In the present embodiment, the metal cylinders 2 are used as cylindrical conductors that act as control terminals. Alternatively, holes, which penetrate through the sealing transfer molding resin 3 so as to reach the surface of the lead frame, may be formed; and then, a conductive portion may be formed inside of each hole by performing plating or the like. The cylindrical conductors acting as control terminals may be formed in this alternative manner.

It is desirable that connections of the external terminals 4 with the metal cylinders 2 of the power semiconductor module 100 of the present embodiment are formed not by soldering but by press-in connection, typically press fitting, with which the connections can be readily formed only with pressure. Such connections are desirable from the viewpoints of: reliability at joints; simplicity of the connecting process; and cost efficiency.

Since the press-in connection is used, it is preferred that the external terminals 4 are formed of metal having excellent thermal conductivity and electrical conductivity and a resilient characteristic. In particular, it is desirable that the external terminals 4 are each formed of a copper material.

Figure 4:
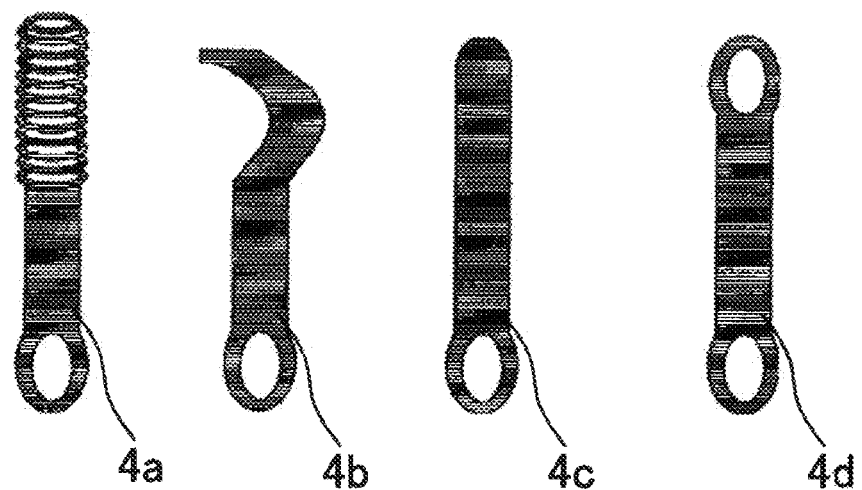
FIG. 4 shows external terminals to be used in the power semiconductor module according to the first embodiment of the present invention.

FIG. 4 shows external terminals to be used in the power semiconductor module according to the first embodiment of the present invention.

The lower portion of each of the external terminals 4 shown in FIG. 4, which is to be inserted into a control terminal, has a shape of a compliant pin, i.e., a press fit configuration. However, the lower portion may have a different press fit configuration such as a star pin configuration.

The shape of the upper portion of each external terminal 4 is determined based on the shape of an external circuit electrically connected to the power semiconductor module. In the case where a connection between the power semiconductor module and an external circuit is formed at the pattern portion of a printed circuit board, a first external terminal 4a of which the upper portion to be connected to the pattern portion has a coiled-spring shape, or a second external terminal 4b of which the upper portion to be connected to the pattern portion has a hooked-spring shape, is used. Since these external terminals are electrically connected to the pattern portion of the printed circuit board by being pressed thereto, dimensions of an area necessary to form the connection can be small.

Further, in the case where a connection between the power semiconductor module and an external circuit is formed at a through hole of a printed circuit board, a third external terminal 4c of which the upper portion to be connected to the through hole has a shape for solder connection, or a fourth external terminal 4d of which the upper portion to be connected to the through hole has a shape for press-fit connection, is used. Since these external terminals are connected to the through hole of the printed circuit board, connection reliability is excellent.

In the power semiconductor module 100 according to the first embodiment, the main terminals connected to the main circuits each having a large current carrying capacity are the terminal portions 5 of the lead frame 1, which protrude from the peripheral side portions of the transfer molding resin 3. The control terminals connected to the control circuits are provided on the lead frame surface so as to be substantially perpendicular to the lead frame surface. The openings of the control terminals are present at a plane that is in parallel to the lead frame surface of the transfer molding resin 3.

That is, since the terminal portions 5 of the lead frame 1 act only as main terminals, the number of terminal portions 5 is not large. Accordingly, the terminal portions 5 are allowed to have a sufficient insulation distance therebetween. Further, since the metal cylinders 2 are used as control terminals, a current applied to each metal cylinder 2 is small. Accordingly, it is not necessary that each control circuit of the power semiconductor module is provided, at a connection to an external circuit, with multiple metal cylinders 2.

For this reason, even if the current carrying capacity of the power semiconductor module increases, it is not necessary to increase the size of the power semiconductor module.

Figure 5:
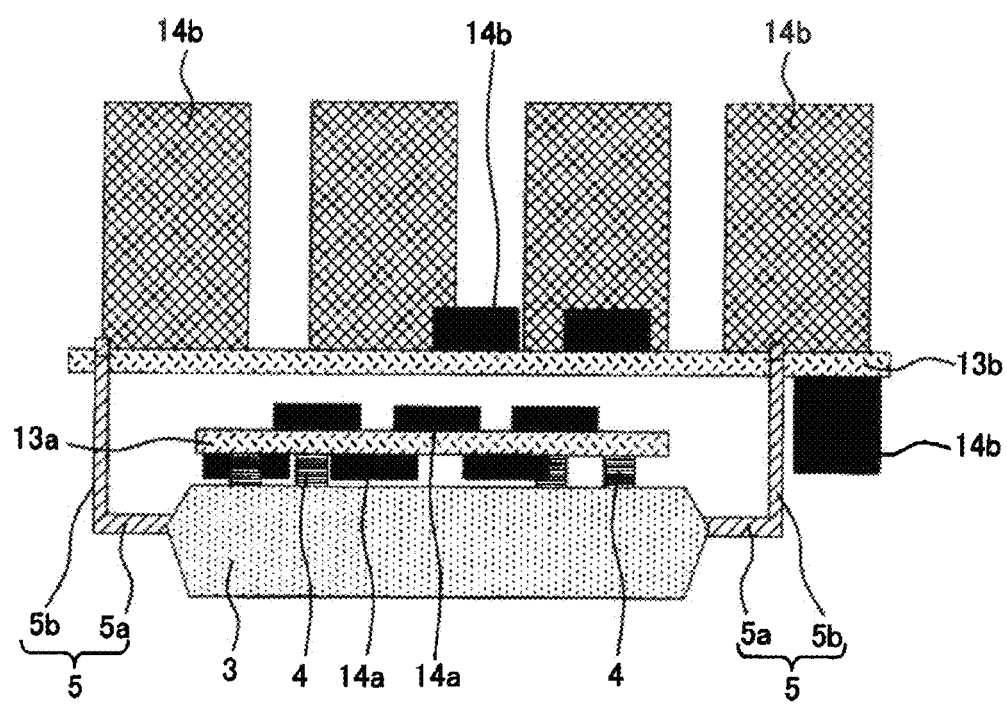
FIG. 5 is a schematic cross-sectional view showing that external circuits are connected to the power semiconductor module according to the first embodiment of the present invention.

FIG. 5 is a schematic cross-sectional view showing that external circuits are connected to the power semiconductor module according to the first embodiment of the present invention.

As shown in FIG. 5, the external terminals 4 are inserted into control terminals of a power semiconductor module 101 of the present embodiment, to which power semiconductor module 101 external circuits are connected (hereinafter, referred to as an external-circuit-connected power semiconductor module). These external terminals 4 are connected to a first external printed circuit board 13a on which small surface-mount components 14a, such as small capacitors and resistors, are mounted. The connecting portions 5b of the terminal portions 5 acting as main terminals are connected to a second external printed circuit board 13b on which large surface-mount components 14b, such as large capacitors and resistors, are mounted.

The first external printed circuit board 13a and the second external printed circuit board 13b can be arranged, in a two-stage configuration, on the power semiconductor module 100 of the present embodiment, by adjusting the height of the external terminals 4 and the height of the connecting portions 5b of the terminal portions 5. In other words, the external printed circuit boards forming external circuitry can be arranged in a stacked manner. This allows the power semiconductor module to be reduced in size.

Second Embodiment

Figure 6:
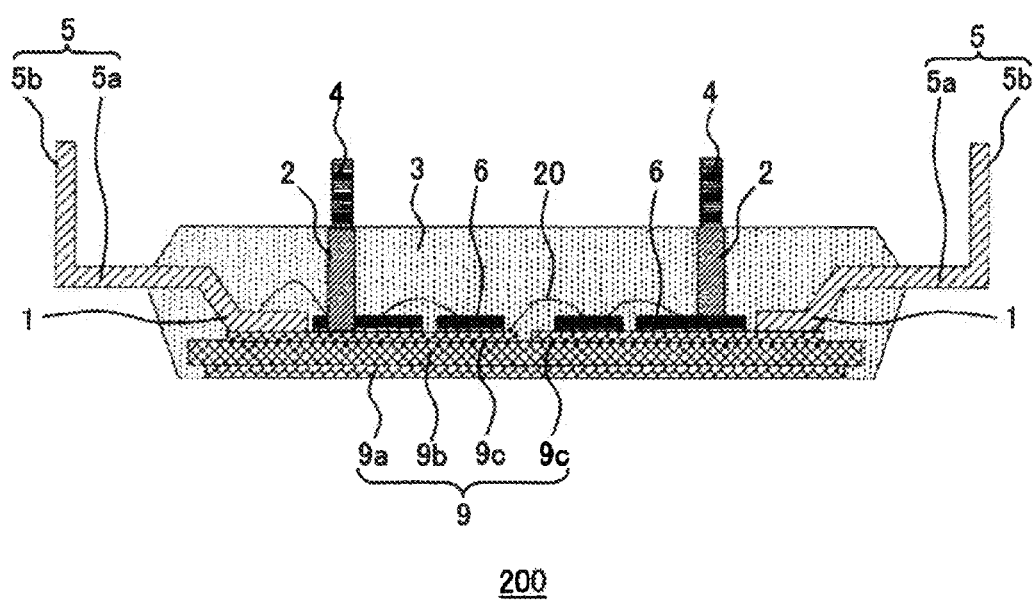
FIG. 6 is a schematic cross-sectional view of a power semiconductor module according to the second embodiment of the present invention.

FIG. 6 is a schematic cross-sectional view of a power semiconductor module according to the second embodiment of the present invention.

As shown in FIG. 6, in a power semiconductor module 200 of the present embodiment, a ceramic circuit substrate 9 is used, which includes: a ceramic plate 9b, a copper foil 9a that is a metal body provided on one surface of the ceramic plate 9b, and a copper wiring pattern 9c provided on the other surface of the ceramic plate 9b. The power semiconductor module 200 of the present embodiment is the same as the power semiconductor module 100 of the first embodiment except that the power semiconductor elements 6 and the metal cylinders 2 are mounted on the wiring pattern 9c of the ceramic circuit substrate 9, and that the said other surface of the lead frame 1 is joined to the wiring pattern 9c.

In the power semiconductor module 200 of the present embodiment, the respective components are joined to the wiring pattern 9c of the ceramic circuit substrate 9. Accordingly, these components can be mounted with higher mounting density. This allows the power semiconductor module to be further reduced in size.

Third Embodiment

Figure 7:
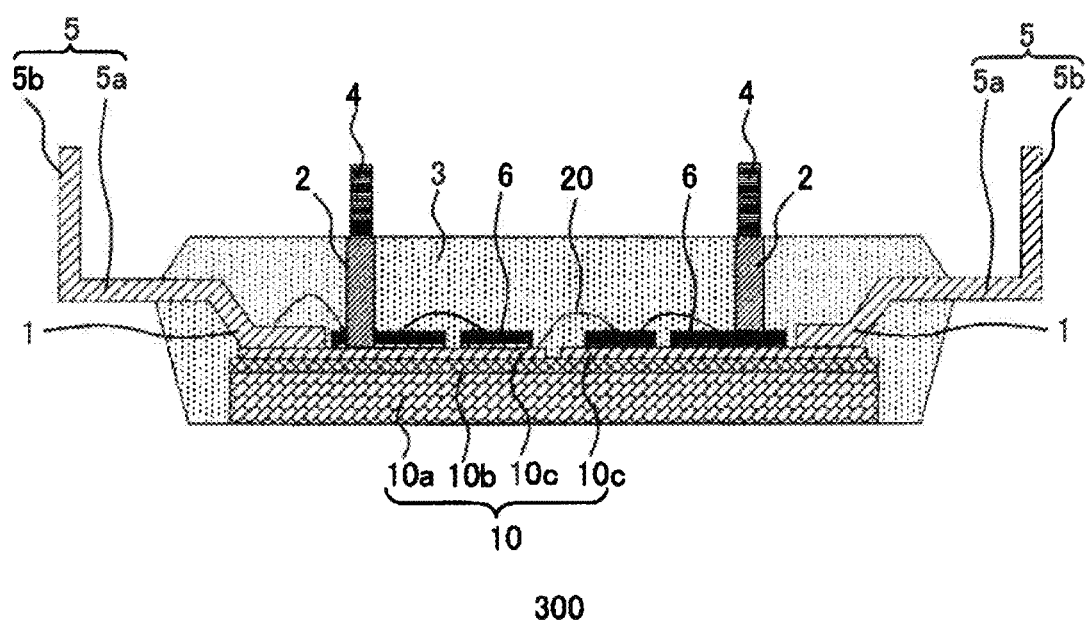
FIG. 7 is a schematic cross-sectional view showing a power semiconductor module according to the third embodiment of the present invention.

FIG. 7 is a schematic cross-sectional view showing a power semiconductor module according to the third embodiment of the present invention.

As shown in FIG. 7, in a power semiconductor module 300 of the present embodiment, a metal circuit substrate 10 is used, which includes a metal plate 10a and a metallic foil wiring pattern 10c that is provided above one surface of the metal plate 10a while a resin insulation layer 10b is interposed between the wiring pattern 10c and the metal plate 10a. The power semiconductor module 300 is the same as the power semiconductor module 100 of the first embodiment except that the power semiconductor elements 6 and the metal cylinders 2 are mounted on the wiring pattern 10c of the metal circuit substrate 10, and that the said other surface of the lead frame 1 is jointed to the wiring pattern 10c.

In the power semiconductor module 300 of the present embodiment, since the respective components are joined to the wiring pattern 10c of the metal circuit substrate 10, these components can be mounted with higher mounting density. This allows the power semiconductor module to be further reduced in size.

Fourth Embodiment

Figure 8:
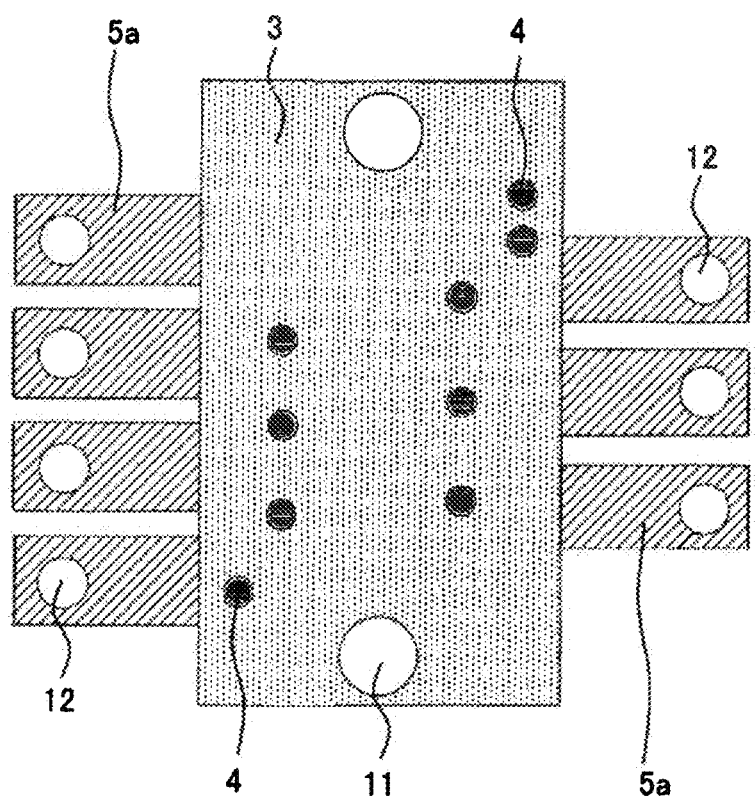
FIG. 8 is a schematic top view showing a power semiconductor module according to the fourth embodiment of the present invention.

FIG. 8 is a schematic top view showing a power semiconductor module according to the fourth embodiment of the present invention.

Figure 9:
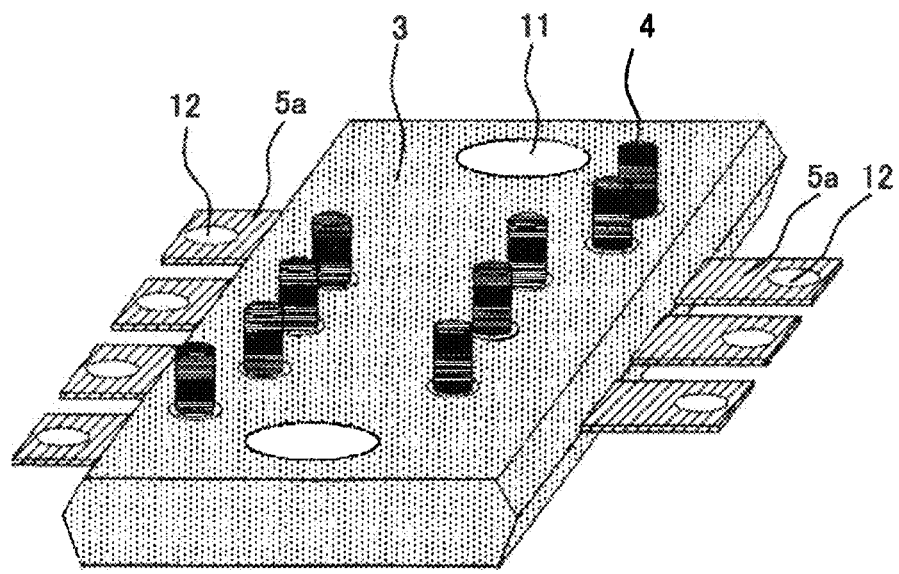
FIG. 9 is a schematic perspective view showing the power semiconductor module according to the fourth embodiment of the present invention.

FIG. 9 is a schematic perspective view showing the power semiconductor module according to the fourth embodiment of the present invention.

As shown in FIGS. 8 and 9, a power semiconductor module 400 of the present embodiment is the same as the power semiconductor module 100 of the first embodiment except that the terminal portions 5 acting as main terminals only include the protruding portions 5a horizontally protruding from the transfer molding resin 3, and that the protruding portions 5a acting as the main terminals are each provided with a conductor-fitting hole 12 for connecting a conductor thereto via a bolt, which conductor is conductive with an external circuit. The conductor-fitting hole 12 may have a female screw structure to be screwed onto a bolt.

In the power semiconductor module 400 of the present embodiment, the main terminals connected to the main circuit are each provided with the conductor-fitting hole 12. A conductor conductive with an external circuit can be connected to the conductor-fitting hole 12 via a bolt.

Figure 10:
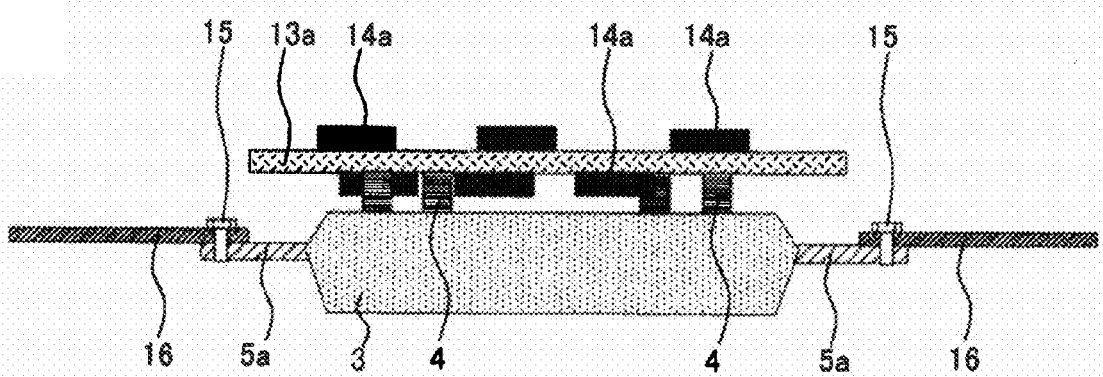
FIG. 10 is a schematic cross-sectional view showing that external circuits are connected to the power semiconductor module according to the fourth embodiment of the present invention.

FIG. 10 is a schematic cross-sectional view showing that external circuits are connected to the power semiconductor module according to the fourth embodiment of the present invention.

As shown in FIG. 10, the external terminals 4 are inserted into control terminals of an external-circuit-connected power semiconductor module 401 of the present embodiment. The external terminals 4 are connected to the first external printed circuit board 13a on which the small surface-mount components 14a, such as small capacitors and resistors, are mounted. Bus bar substrates 16, which are conductors conductive with an external circuit, are connected via bolts 15 to the screw holes 12 provided in the protruding portions 5a acting as main terminals.

In the present embodiment, although the bus bar substrates are used as conductors conductive with an external circuit, cables may be used as the conductors, instead.

A wiring process between the power semiconductor module 400 of the present embodiment and external circuits is simple for the reason that: an external circuit to be connected to the control terminals can be connected to the external terminals 4 that are arranged on the top surface of the transfer molding resin 3; and an external circuit to be connected to the main terminals can be connected, via conductors such as bus bar substrates or cables, to the protruding portions 5a of the lead frame, which protrude from the peripheral side portions of the transfer molding resin 3.

Also to the power semiconductor module 400 of the present embodiment, the structure of the second embodiment using the ceramic circuit substrate 9, or the structure of the third embodiment using the metal circuit substrate 10, can be applied.

The power semiconductor module according to the present invention is small in size, and a wiring process between the power semiconductor module and external circuits is simple. Therefore, the power semiconductor module according to the present invention can be effectively utilized as a power semiconductor device having a large current carrying capacity.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor module comprising:
   a lead frame having an upper surface and a lower surface;
   plural power semiconductor elements disposed on the upper surface of the lead frame; and
   a cylindrical conductor disposed on the upper surface of the lead frame in electrical and mechanical contact with the lead frame, wherein,
   a part of the lead frame, the power semiconductor elements, and the cylindrical conductor are sealed with transfer molding resin, the molding resin surrounding the cylindrical conductor,
   the cylindrical conductor includes a hole exposed at a top surface of the transfer molding resin, and
   the lead frame includes a first portion having first terminals that protrude from a first peripheral side of the transfer molding resin, and a second portion having second terminals that protrude from a second peripheral side that is opposite to the first peripheral side of the transfer molding resin, each portion forms a continuous structure from an area located underneath one of the power semiconductor elements to a corresponding one of the first and second terminals, respectively, and the first and second portions of the lead frame are discontinuous from each other.

2. The power semiconductor module according to claim 1, wherein:
   the power semiconductor elements and the cylindrical conductor are joined to the upper surface of the lead frame,
   a metal base plate is joined to the lower surface of the lead frame via an insulation sheet interposed therebetween, and
   the cylindrical conductor is arranged on the upper surface of the lead frame so as to be substantially perpendicular to the upper surface.

3. The power semiconductor module according to claim 1, further comprising:
   a second cylindrical conductor that is in electrical connection with a control circuit of the power semiconductor elements, wherein
   the first terminals of the lead frame are in electrical connection with a main circuit of the power semiconductor elements.

4. The power semiconductor module according to claim 1, wherein,
   the first and second terminals of the lead frame each include:
   a protruding portion that horizontally protrudes from the transfer molding resin; and
   a connecting portion that is bent to a vertical direction.

5. The power semiconductor module according to claim 1, wherein,
   the first and second terminals of the lead frame each include:
   a protruding portion that horizontally protrudes from the transfer molding resin, wherein
   the protruding portion is provided with a conductor-fitting hole.

6. The power semiconductor module according to claim 1, wherein
   an external terminal is inserted into the hole of the cylindrical conductor.

7. The power semiconductor module according to claim 6, wherein,
   a lower portion of the external terminal is inserted into the hole of the cylindrical conductor, the lower portion has a shape for press-fit connection,
   an upper portion of the external terminal is connected to an external circuit, and
   the external terminal is one selected from the group consisting of a first external terminal of which the upper portion has a coiled-spring shape, a second external terminal of which the upper portion has a hooked-spring shape, a third external terminal of which the upper portion has a shape for solder connection, and a fourth external terminal of which the upper portion has a shape for press-fit connection.

* * * * *